United States Patent [19]
Chang et al.

[11] Patent Number: 5,328,866
[45] Date of Patent: Jul. 12, 1994

[54] LOW TEMPERATURE OXIDE LAYER OVER FIELD IMPLANT MASK

[75] Inventors: Mike F. Chang, Cupertino; David G. Grasso, San Jose; Jun-Wei Chen, Saratoga, all of Calif.

[73] Assignee: Siliconix Incorporated, Santa Clara, Calif.

[21] Appl. No.: 949,288

[22] Filed: Sep. 21, 1992

[51] Int. Cl.[5] .......................................... H01L 21/76
[52] U.S. Cl. ...................... 437/70; 437/27; 437/69; 437/34
[58] Field of Search ................ 437/70, 27, 34, 69

[56] References Cited

U.S. PATENT DOCUMENTS

| | | | |
|---|---|---|---|
| 4,110,899 | 9/1978 | Nagasawa et al. | 437/34 |
| 4,277,291 | 7/1981 | Cerofolini et al. | 437/70 |
| 4,373,965 | 2/1983 | Smigelski | 437/70 |
| 4,391,650 | 7/1983 | Pfeifer et al. | 437/34 |
| 4,812,418 | 3/1989 | Pfiester et al. | 437/69 |
| 4,879,583 | 11/1989 | Custode | 257/375 |
| 4,887,142 | 12/1989 | Bertotti et al. | 257/547 |
| 5,156,989 | 10/1992 | Williams et al. | 437/34 |

OTHER PUBLICATIONS

Runyan et. al., "Semiconductor Integrated Circuit Processing Technology" Addison-Wesley Publishing Company; pp. 108-112; 1990.
Glaser et al., "Integrated Circuit Engineering Design, Fabrication, and Applications" Addison-Wesley Publishing Co., pp. 260-263, 1979.
Wolf, "Silicon Processing For the VLSI Era" vol. 2, Process Integration, Lattice Press; pp. 12-45; 1990.

Primary Examiner—Brian E. Hearn
Assistant Examiner—Trung Dang
Attorney, Agent, or Firm—Skjerven, Morrill MacPherson, Franklin & Friel

[57] ABSTRACT

A thin base oxide is disposed over both an active area and also over a field area of a substrate. A thin silicon-nitride layer is then formed over the base oxide in the active area to protect the underlying substrate from oxygen and/or water vapor during a subsequent field oxidation step. This thin nitride layer is, however, insufficiently thick to serve as a field implant mask in a subsequent field implant step. An additional low temperature oxide (LTO) layer is therefore provided over the nitride layer in the active area. The field implant step is then performed using the base oxide, the thin nitride, and the overlying LTO as a field implant mask. The boundaries of the overlying LTO define a field implant boundary. After the field implant step but before the field oxidation step, the LTO layer is removed from the top of the thin nitride layer. As a result, only the base oxide and the thin nitride layer is disposed over the active area during field oxidation. Therefore, in comparison to previous methods using thicker nitride layers, the present invention employs a thin nitride layer during the field oxidation step, thereby reducing the amount of stress induced in the nitride layer and thereby minimizing problems associated with thick nitride layers such as the introduction of lattice defects into the underlying silicon substrate. The thin nitride process of the present invention may, for example, be incorporated into a BiCDMOS process.

15 Claims, 8 Drawing Sheets

LOW TEMPERATURE OXIDE LAYER OVER FIELD IMPLANT MASK

FIELD OF THE INVENTION

This invention relates to a process for forming a region of field oxide having an underlying self-aligned field implant.

BACKGROUND OF THE INVENTION

In MOSFET (metal oxide silicon field effect transistor) integrated circuit structures, for example, multiple laterally disposed MOSFETs are typically formed on the top surface of a semiconductor substrate. These multiple individual MOSFETs are interconnected in a desired fashion using electrically conductive lines which are disposed over, but still insulated from, the top surface of the underlying substrate. If such an electrically conductive line were to extend over a region having either two N type semiconductor regions separated by a P type semiconductor region or two P type semiconductor regions separated by an N type semiconductor region, then the overlying electrically conductive line would form the gate of an undesired MOSFET.

To prevent such an undesired MOSFET from turning on, the threshold voltage of the undesired MOSFET is made to be sufficiently higher than the threshold voltages of the desired MOSFETs on the substrate. Accordingly, the switching on and off of desired MOSFETs via the electrically conductive lines will not cause any undesired intervening MOSFETs to turn on. This increasing of the threshold voltage of the undesired MOSFETs may be accomplished in at least two ways: 1) by doping the channel region of the undesired MOSFET to increase the threshold voltage at which inversion of the channel region will occur, and 2) by increasing the thickness of the field oxide insulator between the electrically conductive line (the gate of the undesired MOSFET) and the underlying channel region of the undesired MOSFET. The LOCOS (LOCal Oxidation of Silicon) process is a well known process commonly used to carry out the above described principles to increase the threshold voltage of intervening undesired MOSFETs. The LOCOS process results in an isolation structure comprising a thick oxide layer (commonly referred to as the field oxide) and an underlying doped field implant layer (commonly referred to as the channel-stop or the field implant).

According to one type of LOCOS process, a layer of a material which is relatively impervious to oxygen and water vapor is formed on the top surface of a semiconductor substrate. The material commonly used is silicon-nitride, hereafter simply referred to as "nitride". This nitride layer is selectively etched away in the field regions leaving only the active regions covered by nitride. After the exposed field regions are ion implanted with a channel-stop dopant, a thermal oxidation process is performed to grow a relatively thick field oxide in the exposed field regions. Due to the oxygen and water vapor impervious characteristics of the nitride layer, the surface of the substrate in the active area is not oxidized in this step.

Tensile stress, however, develops at the silicon-to-nitride boundary. This results in a lateral force being applied to the underlying substrate which, if adequately great, can cause defects in the silicon substrate by dislocation of silicon atoms from the silicon crystal lattice. Because transistor performance is degraded when transistors are built in silicon containing defects, usable silicon area on the die is lost and the resulting integrated circuit cannot be made as small as it otherwise could be. A thin layer of silicon dioxide is therefore commonly provided between the nitride layer and the underlying substrate to reduce the transmission of stress from the silicon to nitride boundary to the substrate and thereby to prevent lattice defects from forming in the substrate.

Silicon dioxide, however, is relatively pervious to oxygen and water vapor. As a result, oxygen and/or water vapor may diffuse laterally into the oxide layer from the exposed side edges of the oxide layer at the field region/active region boundary. As a result, silicon underneath the outer portions of the nitride layer is oxidized. Because the volume of silicon dioxide is almost twice the volume of the silicon it consumes, the silicon dioxide growing under the lateral extent of the nitride layer also lifts the lateral extent of the nitride layer. The more the nitride layer is lifted, the greater the opening for oxygen and/or water vapor to diffuse laterally through the oxide. The resulting shape of the oxide is commonly referred to as a "bird's beak" which points in toward the active region.

Texts describing uses of the LOCOS process, recognized problems with the LOCOS process, and variations on the LOCOS process include: *Silicon Processing For The VLSI Era, Volume 2: Process Integration*, by Stanley Wolf, Lattice Press, 1990, pages 12-45; *Semiconductor Integrated Circuit Processing Technology*, by Walter Runyan and Kenneth Bean, Addison-Wesley Publishing Company, 1990, pages 108-112; and *Integrated Circuit Engineering, Design Fabrication, and Applications*, by Arthur Glaser and Gerald Subak-Sharpe, Addison-Wesley Publishing Company, 1977.

In some LOCOS processes, the nitride layer and the underlying silicon dioxide layer are used as a mask to protect the active region during the field implant step. This way the boundaries of the field implant region will be self-aligned with the boundaries of the nitride layer. When the field oxide is grown in a later step, the field oxide will similarly be aligned with the underlying field implant region. Because an unprotected silicon surface may be damaged during ion implantation, the silicon dioxide layer between the nitride layer and the underlying substrate typically extends over the field region as well as over the active region. The field implant is then performed through the silicon dioxide layer in the field regions, the nitride layer serving to define the boundaries of the implanted region. The nitride layer can more easily block the relatively large phosphorous N-field ions, but the smaller boron P-field ions can penetrate a significantly greater distance through the nitride layer. As a consequence, extra masking protection needs to be provided for the active region without losing the self-aligning feature of the active region nitride mask.

A technique has heretofore been used to provide this masking protection for the active regions. A thicker nitride layer adequately thick to block the smaller boron ions is provided. This technique, however, has drawbacks. Providing a thicker nitride layer may introduce greater stress in the underlying substrate, may cause the nitride layer to develop cracks, may result in a so-called "white ribbon" or "Kooi nitride" thinning of the edges of the field oxide, and may present etching problems. Because thinning of the field oxide reduces the voltage at which the underlying silicon will invert, the isolation function of the field oxide is degraded.

FIG. 1A (PRIOR ART) is a cross-sectional view of thick nitride layer 1 and an underlying oxide layer 2 of the prior art. It is the thick nitride layer 1 and the underlying thin base oxide layer 2 which together mask implanted ions before field oxidation during the field implant step.

FIG. 1B (PRIOR ART) is a cross-sectional view of a self-aligned boundary 3 between an active region and a field region. Thick nitride layer 1 and thin base oxide 2 are shown disposed over the top surface of substrate 7 in the active region after the field oxidation step has been performed. A field implant region 5 is shown disposed underneath field oxide layer 6 in the field region. A bird's beak 4 of silicon dioxide at the rightmost extent of field oxide 6 is shown wedging underneath the leftmost extent of thick nitride layer 1 between the nitride layer 1 and the substrate 7. The leftmost extent of nitride layer 1 is therefore shown deformed and bent upward by the bird's beak. The resistance of the thick nitride layer 1 to this deformation causes the nitride layer 1 to exert a force on the underlying silicon substrate in the vicinity of the self-aligned boundary 3. As described above, exerting a force on the substrate has deleterious consequences including the formation of dislocation defects in the silicon lattice of substrate 7. The more the nitride layer resists the deformation, the greater the stress and the greater the force. Because a thicker nitride layer 1 resists the deformation more than a thinner nitride layer, increasing the thickness of the nitride layer commonly results in silicon defects in the silicon substrate around the bird's beak 4.

After the field oxide layer 6 has been grown, the nitride layer 1 and the underlying base oxide layer 2 are removed from the active region, thereby leaving the field oxide layer in the field region.

SUMMARY OF THE INVENTION

The present invention provides the required active region masking without the attendant drawbacks of an extra selective oxidation step or a thicker nitride layer. According to one embodiment of the present invention, a base oxide is disposed over both the active region and also over the field region of the substrate. A relatively thin nitride layer is then provided over the base oxide in the active region to protect the underlying substrate from oxidation. An additional low temperature oxide (LTO) layer is then provided over the nitride layer in the active region to provide the remaining amount of protection required to protect the active region during the field implanting step. Field implanting is then performed using the base oxide, thin nitride, and LTO structure as a field implant mask. After the field implant step but before a field oxidation step, the LTO layer is removed from the thin nitride layer. As a result, only the base oxide and the thin nitride layer is disposed over the active region during the subsequent field oxidation and bird's beak formation. Therefore, in comparison to previous methods using thicker nitride layers, the present invention reduces the amount of stress induced in the nitride layer because the nitride layer is thinner. As a result, problems associated with thick nitride layers are avoided including Kooi nitride problems and including the introduction of lattice defects into the underlying silicon substrate.

DETAILED DESCRIPTION OF THE PREFERRED EMBODIMENTS

FIGS. 2A-2I are cross-sectional views showing various stages in the processing of a self-aligned boundary region 201 between an active region 202 and a field region 203 of a semiconductor body 205.

Figure 1A:
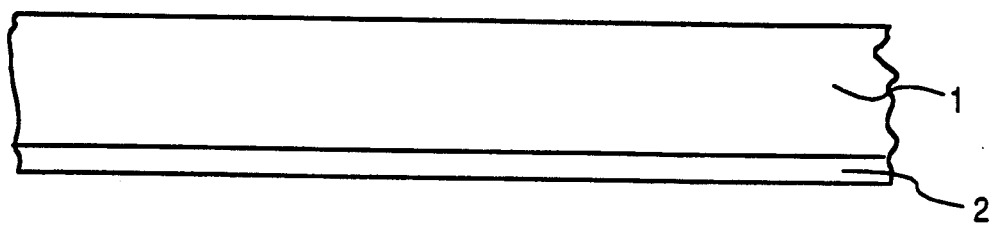
FIG. 1A (PRIOR ART) is a cross-sectional view of a thick nitride LOCOS mask according to the prior art.
Figure 1B:
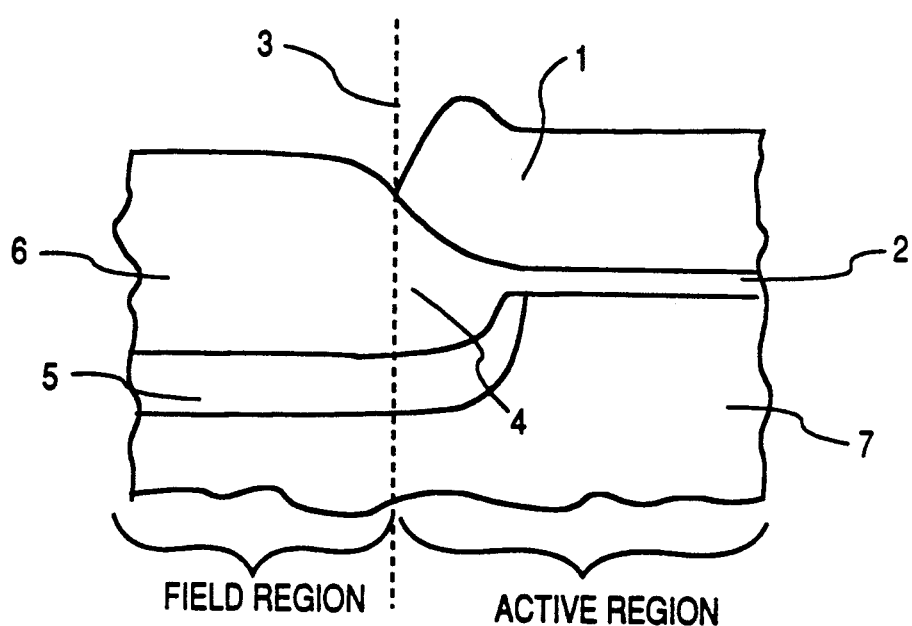
FIG. 1B (PRIOR ART) is a cross-sectional view of a self-aligned boundary between a field region and an active region using a thick nitride LOCOS mask according to the prior art.
Figure 2A:
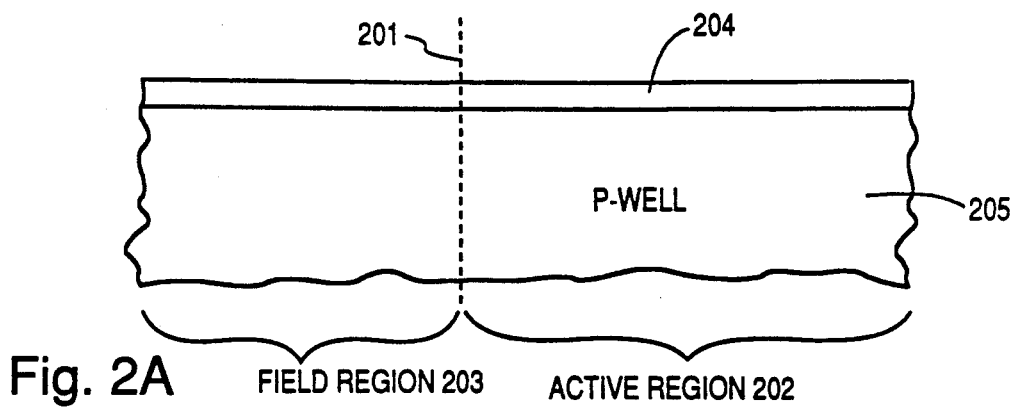
FIGS. 2A-2G are cross-sectional views showing various stages in the formation of a field oxide structure according to one embodiment of the present invention.

FIG. 2A shows a step in the process wherein a base oxide layer 204 is formed on the top surface of an P— type semiconductor body 205. In the embodiment shown in FIG. 2A, the semiconductor body is a P— type well region. This semiconductor body may, however, be any semiconductor body such as, for example, a substrate, an epitaxial layer of silicon, or a well region. In FIG. 2A, an upper surface of the semiconductor body 205 extends up to the bottom surface of the base oxide 204. Base oxide layer 204 is disposed over both the active region and also in the field region. In FIG. 2A, the active region 202 lies to the right of boundary 201. The field region 203 lies to the left of boundary 201. The base oxide 204 may, for example, be a thermally grown oxide grown to a thickness of approximately 500 Angstroms.

Figure 2B:
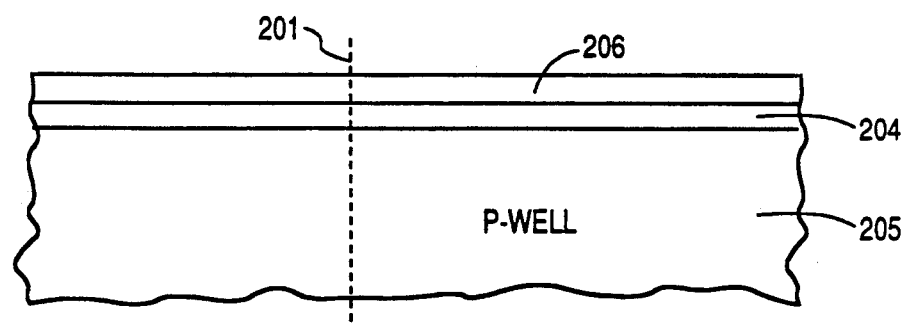

FIG. 2B shows a step of forming a thin silicon nitride layer 206 over the top surface of base oxide layer 204. Thin silicon-nitride layer 206 (hereafter referred to as the nitride layer) extends over both the active region 202 and also the field region 203. The thin nitride layer 204 may, for example, be formed by CVD deposition to have a thickness of approximately 500 to 1000 Angstroms.

Figure 2C:
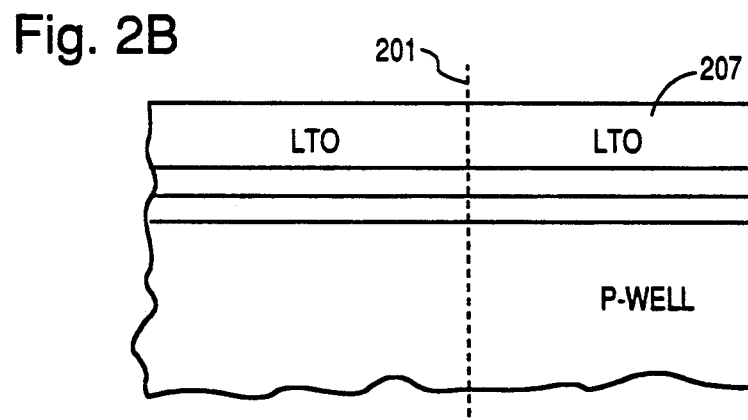

FIG. 2C shows a step of forming a low temperature oxide layer 207 (LTO) over the thin nitride layer 206. The LTO layer 207 extends over both the active region and also the field region. The LTO layer 207 may, for example, be formed by Novellus ($SiH_4 + 2NO_2 \rightarrow SiO_2 + 2N_2 + 2H_2$) deposition at 400° C. for 28 minutes to have a thickness of approximately 2000 Angstroms.

Figure 2D:
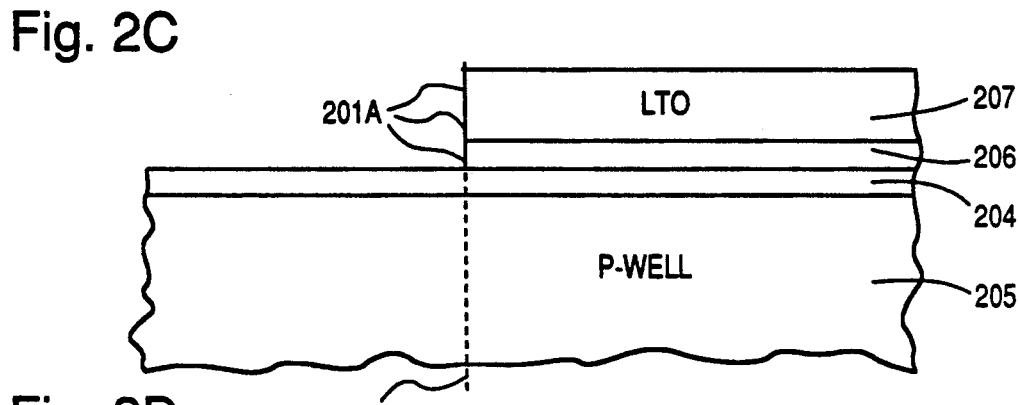

FIG. 2D shows a step of removing the LTO and thin nitride layers from the field region. This step may, for example, be performed by selectively forming a mask of photoresist over the LTO layer 207 in the active region 202 and then etching away the LTO and underlying thin nitride layer with a dry etch. Accordingly, a substantially vertical sidewall 201A is formed at boundary 201. This sidewall 201A is formed both by LTO layer 207 and also by nitride layer 206.

Figure 2E:
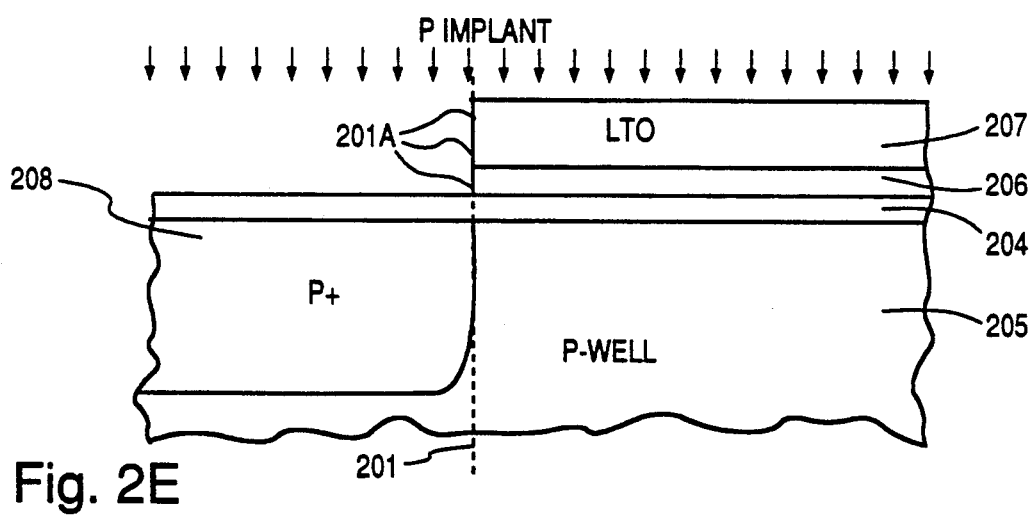

FIG. 2E shows P+ type field implant step wherein the LTO 207, thin nitride 206, and base oxide 204 structure over the active region 202 serve as an implant mask to block P type ions from reaching the underlying semiconductor body 205 under the base oxide 204 in the active region 202. In the field region, however, a P+ type field implant forms a P type silicon channel-stop region 208. The boundaries of the channel-stop region 208 are therefore self-aligned with the boundary 201 of the LTO and thin nitride layer mask at the sidewall 201A. The P+ type field implant step may, for example, be an implant of boron ions accelerated to an energy of 40 KeV and driven into the semiconductor body 205 and then diffused to a depth of approximately 10,000 Angstroms. The projected range of the boron ions into the 2000 Angstrom thick LTO may, for example, be 1400 Angstroms with a standard density of approximately 510 Angstroms. With a standard deviation of approximately 510 Angstroms, 66 percent of the boron ions will be blocked by the top 1400 Angstroms of the LTO.

Figure 2F:
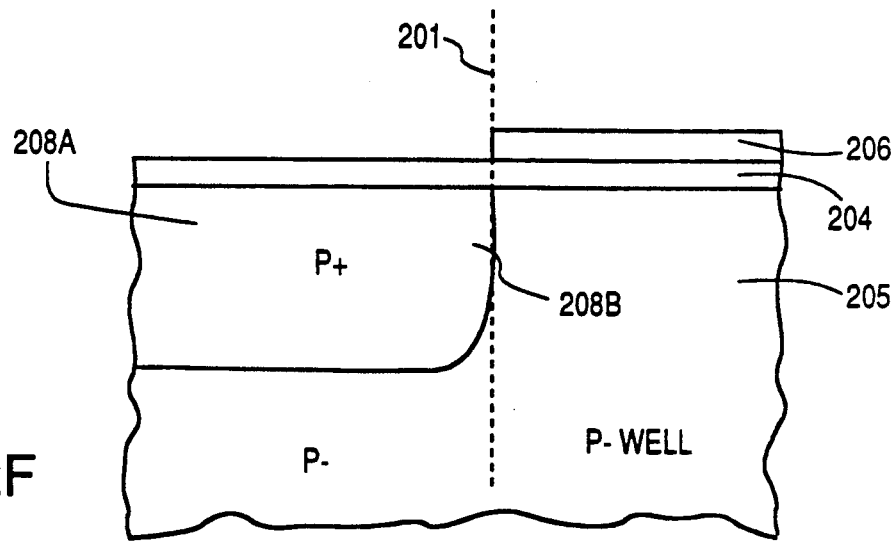

FIG. 2F shows a step of removing the LTO layer 207. The resulting structure is P+type doped silicon in channel-stop region 208, a base oxide 204 extending over both the active region and also the field region, and a thin nitride layer 206 disposed on the base oxide 204 in the active region.

Figure 2G:
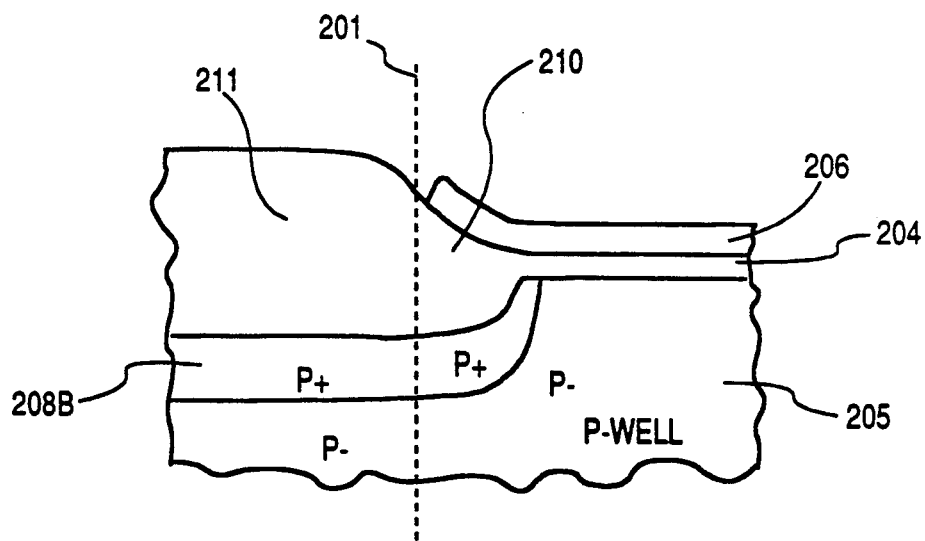

FIG. 2G shows a step of forming a field oxide in the field region 203. Although the nitride layer 206 is relatively imperious to oxygen and water vapor, the base oxide underneath the nitride is pervious to oxygen and water vapor. As a consequence, silicon at the silicon-base oxide boundary in the field region oxidizes. Because silicon dioxide occupies about twice the volume of the silicon which it consumes, the result is that the top surface of the oxide in the field region moves upward.

Because the base oxide is pervious to oxygen and water vapor, oxygen and/or water vapor are able to diffuse laterally to the right in FIG. 2G between the nitride layer 206 and the underlying semiconductor body 205 through the thin oxide layer 204 in the vicinity of the self-aligned boundary 201. As the oxide grows between the nitride 206 and the semiconductor body 205, the nitride layer 206 is pushed upward in the vicinity of the self-aligned boundary to form a pointed oxide structure 210 commonly called a "bird's beak". As the nitride 206 is pushed up, oxygen and/or water vapor are able to diffuse farther in a lateral direction thereby extending the bird's beak 210 farther and farther in a lateral direction between the nitride layer 206 and the semiconductor body 205. The field oxide 211 may, for example, be thermally grown at 950° C. to have a thickness of approximately 8,000 Angstroms. The bird's beak 210 may extend up to 0.75 $\mu$m (7,500 Angstroms) laterally into the active region beyond the self-aligned boundary 201. Despite the formation of the bird's beak 210, the field oxide 211 is nevertheless still self-aligned with the boundary 201 because only one mask, the mask which restricted the LTO 207 and nitride 206 layers to the active region, has been used. The P+ type field implant channel-stop region 208 is shown in FIG. 2G to extend downward into the substrate approximately 2.00 $\mu$m (20,000 Angstroms) below the bottom extent of the field oxide 211.

Figure 3A:
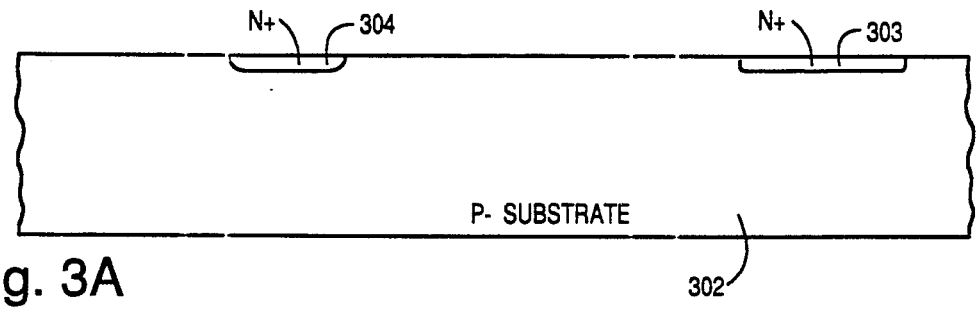
FIGS. 3A-3L are cross-sectional views of a BiCDMOS process incorporating one embodiment of the present invention.
Figure 3B:
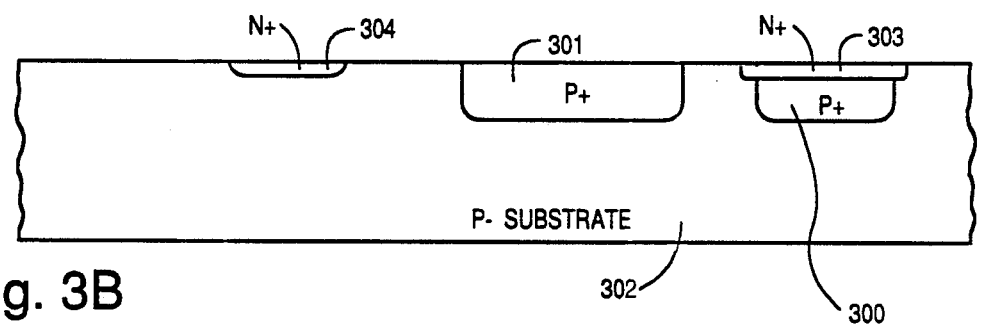

FIGS. 3A-3L are cross-sectional views of a BiCDMOS process incorporating the field oxide unit process described above. As shown in FIG. 3A, N+ type diffusions 303 and 304 are formed in a upper surface of a P type substrate 302. As shown in FIG. 3B, two relatively deep P+ type implants 300 and 301 are then formed in the top surface of the substrate 302. The lateral boundaries of N+ diffusion 303 extend beyond the lateral boundaries of P+ diffusion 300 at the top substrate surface. N+ diffusion 304 is formed in a location on the upper surface of substrate 302 which is laterally spaced from both P+ diffusions 300 and 301.

Figure 3C:
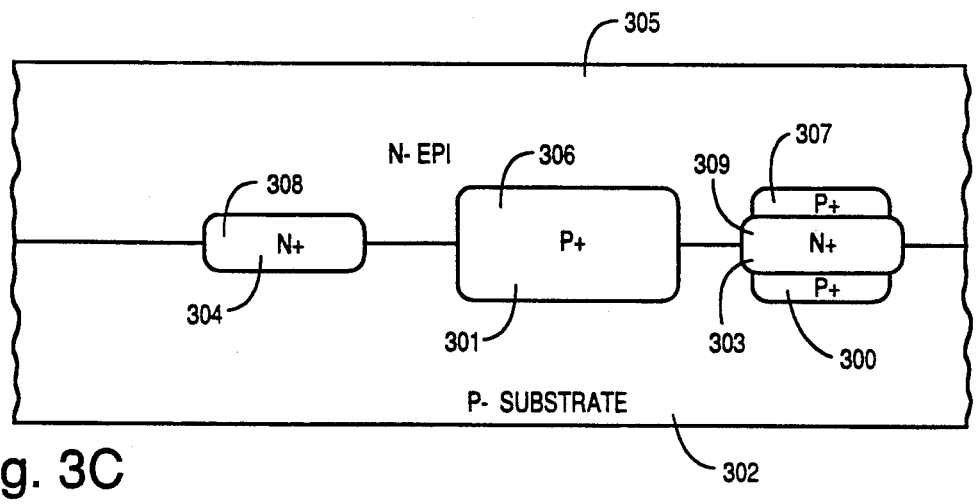

FIG. 3C shows an N− type epitaxial layer 305 disposed over the top surface of substrate 302. Two P+ regions 306 and 307 and two N+ regions 308 and 309 diffuse upward into the epitaxial layer 305 from corresponding region in the underlying substrate 302. The P+ type regions 306 and 307 are shown extending farther into the epitaxial layer 305 because the P type dopants diffuse faster than the N type dopants. N+ type region 303 is more heavily doped with N type dopants than P+ type region 300 is doped with P type dopants so region 309 in FIG. 3C has a net N+ type doping when both the P and N type dopants from the P+ region 300 and the N+ type region 303 diffused upward. The P type dopants from the P+ type region 300, however, diffuse farther and therefore form P+ type region 307 above region 309.

Figure 3D:
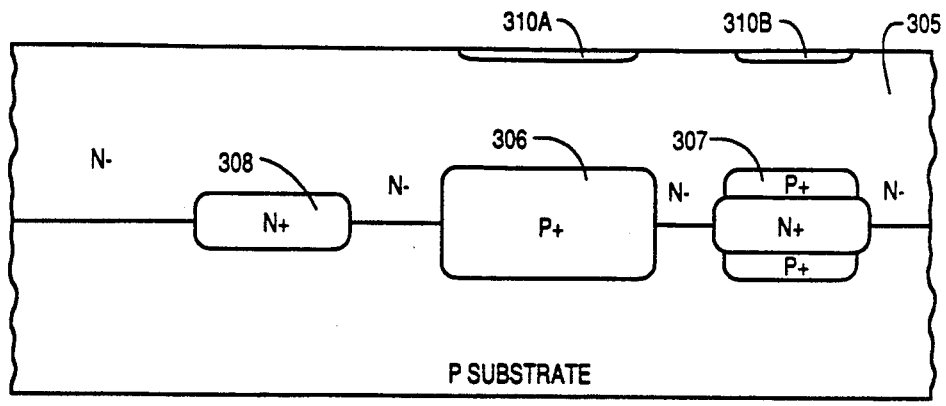

FIG. 3D shows two P type implants 310A and 310B formed in the upper surface of N− epitaxial layer 305 over P+ region 306 and P+ region 307, respectively.

Figure 3E:
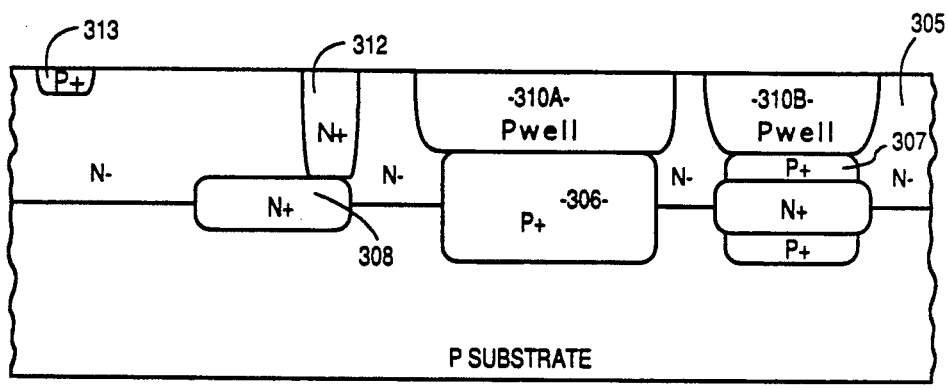

FIG. 3E shows P type regions 310A and 310B thermally diffused downward into the epitaxial layer 305 until P implant 310A meets the top of P+ region 306 and P implant 310B meets the top of P+ region 307. Diffused implant regions 310A-310B are called P wells. An N+ type sinker region 312 is diffused downward into the epitaxial layer 305 to reach deep into epitaxial layer 305 and to make contact with the underlying N+ region 308. A shallow P+ region 313 is also formed into the upper surface of epitaxial layer 305 at a location which is laterally spaced from P well regions 310A-310B and N+ type sinker 312.

Figure 3F:
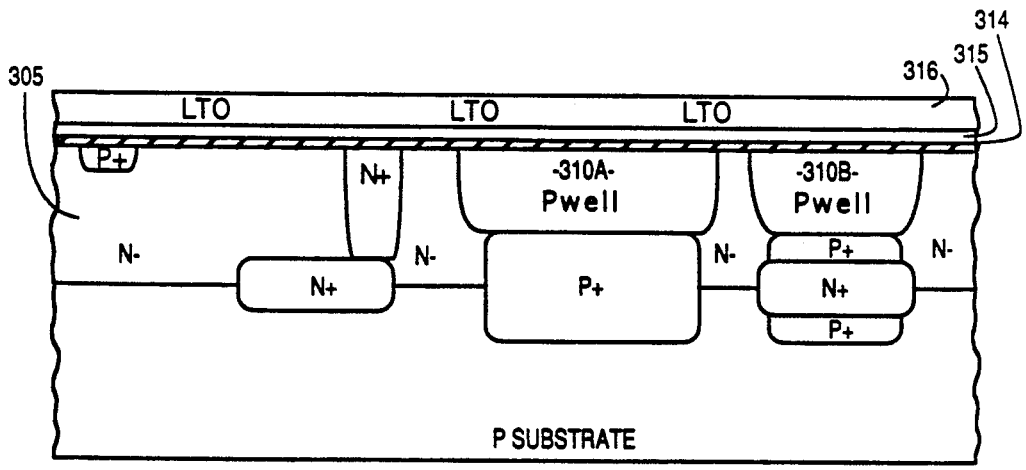

FIG. 3F shows a base oxide layer 314 formed on the upper surface of the epitaxial layer 305. A thin nitride layer 315 is then formed over the base oxide layer 314. A low temperature oxide (LTO) layer 316 is then formed over the thin nitride layer 315.

Figure 3G:
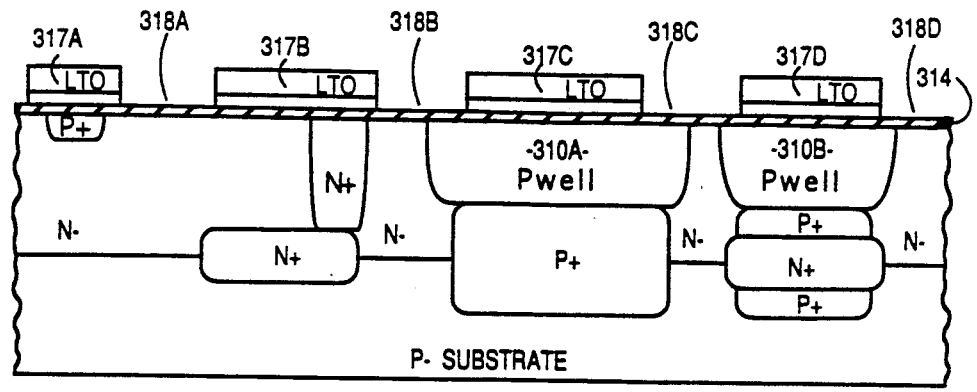

FIG. 3G shows the selective etching away of portions of the LTO and thin nitride layers 316 and 315 to form separate nitride/LTO regions 317A-317D and separate field region openings 318A-318D. The outer extent of regions 317A-317D comprise self-aligned implant boundaries for subsequent implantation steps.

Figure 3H:
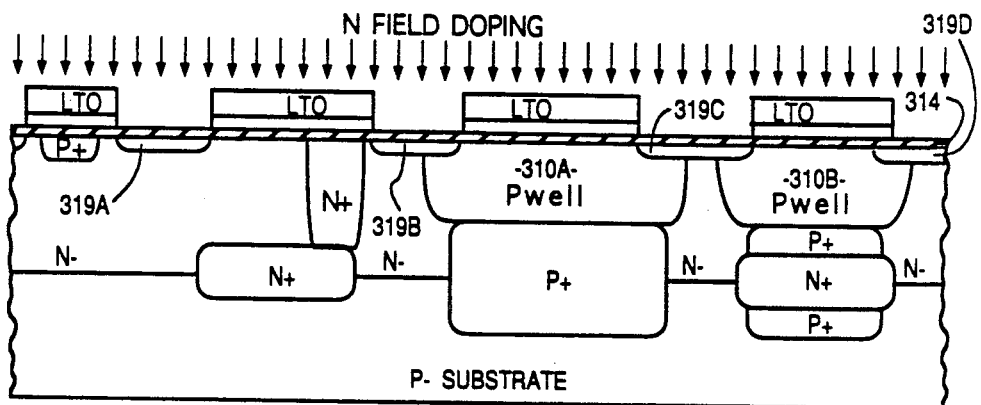

FIG. 3H shows a subsequent N field implant doping step in which an N type dopant such as phosphorous is implanted into the upper surface of epitaxial layer 305 at field region openings 318A-318D. This implant may, for example, be an implant of phosphorous ions accelerated to an energy of 60 KeV and driven into the epitaxial layer and diffused to a depth of 2.0 $\mu$m (20,000 Angstroms). As shown, this N field implant is performed through the base oxide layer 314. Base oxide layer 314 serves to protect the upper surface of the epitaxial layer 305 from damage during the implant. Accordingly, shallow N type regions 319A-319D are formed in the field regions 318A-318D, respectively.

Figure 3I:
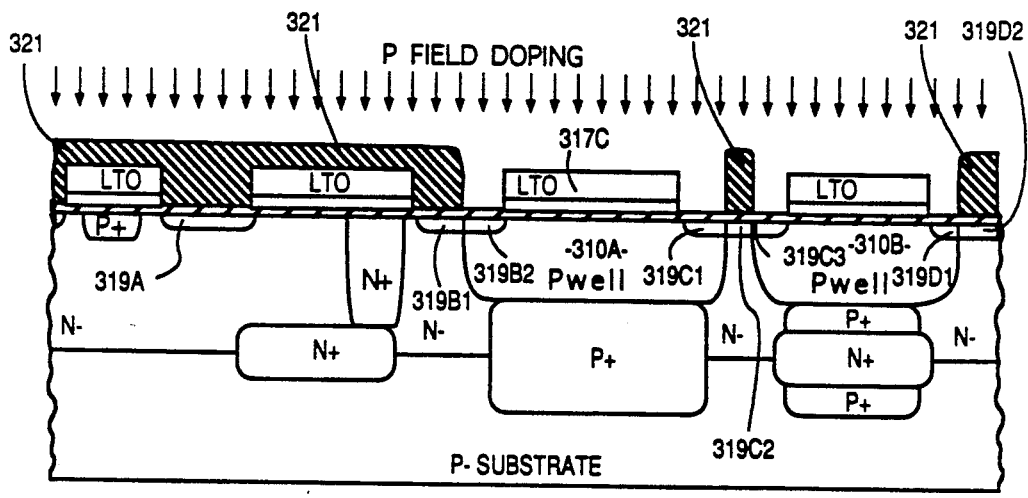

As shown in FIG. 3I, an implant mask 321 is then formed from photoresist so that each region 319B-319D has a masked portion 319B1, 319C2 and 319D2 covered by photoresist and also an unmasked portion 319B2, 319C1, 319C3, 319D1 uncovered by photoresist, respectively. Region 319A is completely covered by photoresist. A P field implant step is then performed with a P type dopant such as boron to form P type implant regions 319B2, 319C1, 319C3 and 319D1. The concentration of the P type dopant implanted into regions 319B2, 319C1, 319C3 and 319D1 is higher than the concentration of N type dopants in the previous N type implanting step so the net result is that each field region 318B–318D has an N type portion 319B1, and 319C2 and 319D2 and at least one P type portion 319B2, 319C1, 319C3, and 319D1.

As shown in FIG. 3I, LTO layer 316, nitride layer 315, and the underlying base oxide layer 314 together serve to mask the center portion of P well 310A as well as the center portion of P well 310B from the N field implant shown in FIG. 3H as well as from the following P field implant shown in FIG. 3I. The P type boron ions are, however, smaller than the relatively larger N type phosphorous ions. As a consequence, the boron ions penetrate farther through the LTO and nitride mask than do the phosphorous ions. The thickness of the mask in the embodiment described in FIGS. 3A–3L is, therefore, determined by the thickness required to stop the P type boron ions. Although any combination of nitride thickness and LTO thickness may be chosen to have a combined effect of stopping the implant ions, the nitride thickness should be chosen to be thin so that the subsequent field oxide growth after LTO removal will result in a small number of silicon defects while at the same time will result in protecting the underlying silicon from oxidation.

Figure 3J:
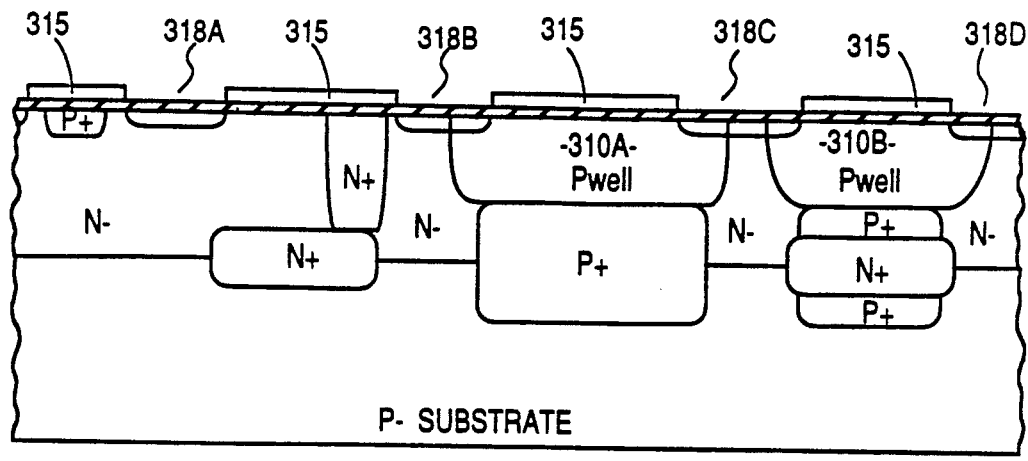

FIG. 3J shows the photoresist mask 321 removed and the LTO layer 316 removed. Thin nitride layer 315 is, however, left in the regions 317A–317D which separate field regions 318A–318D.

Figure 3K:
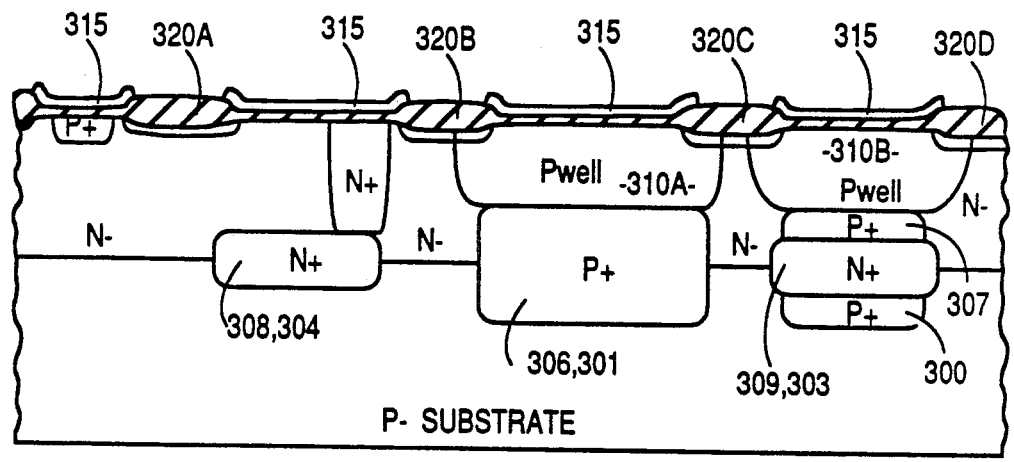

FIG. 3K shows a subsequent thermal oxidation of the top surface of the doped epitaxial layer 305 in the field regions 318A–318D to form thick field oxide regions 320A–320D. Region 319A forms a channel-stop region under thick field oxide 320A; regions 319B1 and 319B2 form a channel-stop region under thick field oxide 320B; regions 319C1, 319C2 and 319C3 form a channel-stop region under thick field oxide 320C; and regions 319D1 and 319D2 form a channel-stop region under thick field oxide 320D.

Figure 3L:
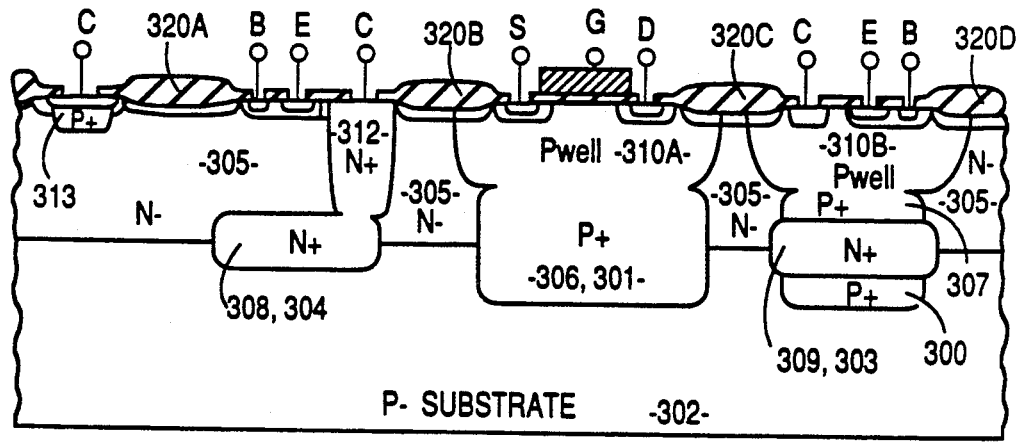

FIG. 3L is a cross-sectional view of a BiCDMOS structure multiple processing steps after FIGS. 3A–3K. A zener diode is formed into epitaxial layer 305 so that P+ region 313 becomes an anode region of the zener diode. A vertical NPN bipolar transistor is formed between field oxide regions 320A and 320B. An NMOS field effect transistor is formed into P well 310A between field oxide regions 320B and 320C. A vertical PNP bipolar transistor is formed into P well 310B between field oxide regions 320C an 320D.

Although the invention has been described by way of the above described embodiments, certain adaptations and modifications may be practiced using other manufacturing methods without departing from the scope of the invention as claimed in the appended claims. The invention is not limited to use in the above described BiCDMOS process but rather may be used in any process where a field oxide is to be self-aligned with an underlying field implant. The above description of the preferred embodiments is, therefore, presented merely for instructional purposes and is not intended to limit the scope of the claimed invention in any way.

We claim:

1. A method, comprising the steps of:
   forming a nitride layer over a first oxide layer, said first oxide layer being disposed over a surface of a semiconductor material;
   forming a second oxide layer over said nitride layer, said second oxide layer being disposed over a first region of said semiconductor material, said second oxide layer not being disposed over a second region of said semiconductor material;
   using said second oxide layer as at least part of an implant mask such that dopant ions are implanted into said second region of said semiconductor material through said first oxide layer and such that substantially no dopant ions are implanted into said first region of said semiconductor material;
   removing said second oxide layer such that said nitride layer is disposed over said first region of said semiconductor material but not over said second region of said semiconductor material; and
   thermally growing a thick oxide in said second region of said semiconductor material after said removing step.

2. The method of claim 1,
   wherein said step of forming said nitride layer and said step of forming said second oxide layer result in said nitride layer being disposed over said first region of said semiconductor material and also result in said nitride layer not being disposed over said second region of said semiconductor material, said nitride layer and said second oxide layer defining a boundary of said implant mask;
   wherein said implanting of said dopant ions forms a region of doped semiconductor material having a boundary, the boundary of said doped semiconductor material being self-aligned with said boundary of said implant mask; and
   wherein said thick oxide comprises a field oxide having a boundary, said boundary of said field oxide being self-aligned with said boundary of said implant mask.

3. The method of claim 2, wherein said first oxide layer is a thermally grown oxide.

4. The method of claim 2, wherein said second oxide layer is a low temperature oxide.

5. The method of claim 1, wherein substantially all said dopant ions are implanted with an implant energy, said implant energy being sufficient to cause said substantially all dopant ions to penetrate through said nitride layer and said first oxide layer, said implant energy being substantially insufficient to cause said substantially all said dopant ions to penetrate through said first oxide layer, said nitride layer and said second oxide layer.

6. The method of claim 1, wherein substantially all said dopant ions are implanted with an implant energy, said implant energy being sufficient to cause said substantially all dopant ions to penetrate through said nitride layer and said first oxide layer, said implant energy being substantially insufficient to cause said substantially all said dopant ions to penetrate through said second oxide layer.

7. The method of claim 6, wherein said dopant ions are boron ions, wherein said implant energy is approximately 40 KeV, wherein said nitride layer has a thickness of not greater than approximately 1500 Angstroms, and wherein said second oxide layer has a thickness of at least approximately 1400 Angstroms.

8. The method of claim 2, wherein said boundary of said implant mask is defined by a substantially vertical sidewall, said second oxide layer forming a part of said sidewall.

9. A method of fabricating a field oxide region for an integrated circuit, comprising the steps of:

forming a stress-relief oxide layer on a surface of a semiconductor body;

forming a nitride layer over said stress-relief oxide layer;

forming an implant block oxide layer over said nitride layer, said block oxide layer being disposed over a first region of said semiconductor body and not being disposed over a second region of said semiconductor body;

implanting dopant ions of a first type into said second region of said semiconductor material through said stress-relief oxide layer;

forming a photoresist implant mask over a first part of said second region of said semiconductor material, said photoresist implant mask not being disposed over a second part of said second region of said semiconductor material;

implanting dopant ions of a second type into said second part of said second region of said semiconductor material;

removing said photoresist implant mask;

removing said implant block oxide layer;

after removing said implant block oxide layer, thermally growing a thick oxide in said second region of said semiconductor material when at least a part of said first oxide layer is disposed over said second region of said semiconductor body; and removing said nitride layer.

10. The method of claim 9, wherein said implanted dopant ions of said first type are implanted into substantially all portions of said surface of said semiconductor material uncovered by said implant block oxide layer, said implant block oxide layer having a boundary, said boundary defining said first region and said second region of said semiconductor material.

11. The method of claim 9, further comprising the step of forming a lateral DMOS field effect transistor in said first region of said semiconductor material after said step of removing of said nitride layer.

12. The method of claim 9, further comprising the step of forming a vertical DMOS field effect transistor at least partially within said first region of said semiconductor material after said step of removing of said nitride layer.

13. A method, comprising the steps of:

thermally growing a first oxide layer on an upper surface of a first region and a second region of a semiconductor body;

forming a nitride layer over said first oxide layer over said first and second regions of said semiconductor body;

depositing a second oxide layer over said nitride layer over said first and second regions of said semiconductor body;

removing said second oxide layer over said second region of said semiconductor body but not removing said second oxide layer over said first region of said semiconductor body;

implanting dopant ions into said second region of said semiconductor body through said first oxide layer over said second region of said semiconductor body using said second oxide layer over said first region of said semiconductor body as at least part of an implant mask such that substantially no ions are implanted into said first region of said semiconductor body, a lateral extent of said second oxide layer defining a boundary of said implant mask;

removing said second oxide layer over said first region of said semiconductor body;

thermally growing a field oxide layer over said second region of said semiconductor body when at least a part of said first oxide layer is disposed over said second region of said semiconductor body, said nitride layer being disposed over said first region of said semiconductor body but not over said second region of said semiconductor body; and removing said nitride layer over said first region of said semiconductor body.

14. The method of claim 13, further comprising the step of:

after said step of removing said second oxide layer over said second region and before said step of implanting dopant ions into said second region, removing said nitride layer over said second region of said semiconductor body, a lateral extent of said nitride layer defining a boundary of said implant mask, said lateral extent of said nitride layer and said lateral extent of said second oxide layer forming a substantially vertical sidewall of said implant mask.

15. The method of claim 14, wherein said first oxide layer has a thickness of approximately 500 Angstroms.

* * * * *